United States Patent
Hanyu et al.

(10) Patent No.: US 11,183,228 B2
(45) Date of Patent: Nov. 23, 2021

(54) MEMORY CIRCUIT DEVICE INCLUDING A SELECTION CIRCUIT UNIT SHARED BY A WRITE CIRCUIT UNIT AND A READ CIRCUT UNIT

(71) Applicant: Tohoku University, Miyagi (JP)

(72) Inventors: Takahiro Hanyu, Miyagi (JP); Daisuke Suzuki, Miyagi (JP); Hideo Ohno, Miyagi (JP); Tetsuo Endoh, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 16/647,155

(22) PCT Filed: Sep. 14, 2018

(86) PCT No.: PCT/JP2018/034229
§ 371 (c)(1),
(2) Date: Mar. 13, 2020

(87) PCT Pub. No.: WO2019/054495
PCT Pub. Date: Mar. 21, 2019

(65) Prior Publication Data
US 2020/0265883 A1      Aug. 20, 2020

(30) Foreign Application Priority Data
Sep. 15, 2017   (JP) .............................. JP2017-178241

(51) Int. Cl.
*G11C 11/16*      (2006.01)
*H01L 27/22*      (2006.01)
*H01L 43/02*      (2006.01)

(52) U.S. Cl.
CPC ........ *G11C 11/1659* (2013.01); *G11C 11/161* (2013.01); *G11C 11/1653* (2013.01);
(Continued)

(58) Field of Classification Search
None
See application file for complete search history.

(56) References Cited

U.S. PATENT DOCUMENTS

| | | | |
|---|---|---|---|
| 2004/0041584 A1* | 3/2004 | Sunaga | G06F 15/7867 326/38 |
| 2010/0315870 A1* | 12/2010 | Abedifard | G11C 11/5607 365/171 |

(Continued)

FOREIGN PATENT DOCUMENTS

| | | |
|---|---|---|
| JP | 61269288 A | 11/1986 |
| JP | 0273591 A | 3/1990 |

(Continued)

OTHER PUBLICATIONS

International Search Report issued in PCT/JP2018/034229 dated Nov. 6, 2018.

(Continued)

*Primary Examiner* — J. H. Hur
(74) *Attorney, Agent, or Firm* — Fox Rothschild LLP; Robert J. Sacco; Carol E. Thorstad-Forsyth

(57) ABSTRACT

A memory circuit device includes multiple memory cells that are each constituted of a resistive memory element; a write circuit unit that is configured to write data to any one of the memory cells which is designated by cell designating information, and a read circuit unit that is configured to read out, from the memory cell designated by the cell designating information, data written in the memory cell. The memory circuit device has a configuration including a selection circuit unit that is shared by both of the write circuit unit and the read circuit unit and configured to select a memory cell to be activated from the multiple memory cells based on cell designating information, and a control circuit unit that is configured to selectively enable any one of writing of data (Continued)

by the write circuit unit and reading of data by the read circuit unit with respect to the memory cell selected by the selection circuit unit.

11 Claims, 13 Drawing Sheets

(52) U.S. Cl.
CPC ...... *G11C 11/1673* (2013.01); *G11C 11/1675* (2013.01); *H01L 27/228* (2013.01); *H01L 43/02* (2013.01)

(56) References Cited

U.S. PATENT DOCUMENTS

2012/0054417 A1* 3/2012 Kim ................ H03K 19/17756
711/103

2015/0070961 A1* 3/2015 Katayama ........... G11C 11/1653
365/66

FOREIGN PATENT DOCUMENTS

| JP | 2000011637 A | 1/2000 |
| JP | 2010081172 A | 4/2010 |
| JP | 2013013059 A | 1/2013 |
| JP | 2017059679 A | 3/2017 |

OTHER PUBLICATIONS

Suzuki et al., "A 71%-Area-Reduced Six-Input Nonvolatile Lookup-Table Circuit Using a Three-Terminal Magnetic-Tunnel-Junction-Based Single-Ended Structure", Japanese Journal of Applied Physics, 2013.

* cited by examiner

MEMORY CIRCUIT DEVICE INCLUDING A SELECTION CIRCUIT UNIT SHARED BY A WRITE CIRCUIT UNIT AND A READ CIRCUT UNIT

TECHNICAL FIELD

The present invention relates to a memory circuit device that is configured in accordance with the logic-in-memory (LIM) circuit technology for example, and to a method for using the memory circuit device.

BACKGROUND ART

Field-Programmable Gate Arrays (FPGAs) equipped with programmable gate arrays and having a programmable calculation function are known as programmable logic devices, for example. A nonvolatile FPGA has the configuration of a logic device that uses a resistive memory element, and is thus capable of maintaining stored contents even when its power is off and reducing standby power consumption.

Nonvolatile programmable logic devices typically tend to have a redundant circuit configuration due to a programmable function. For this reason, simply replacing a volatile memory element with a nonvolatile resistance-element-type memory element results in increasing a circuit size and increasing the area occupied by the device.

In order to suppress such an increase in circuit size, circuit technology called logic-in-memory (hereinafter referred to as LIM) has been proposed, for example (see NPL 1). This LIM circuit technology is technology for downsizing a circuit by integrating a memory function and a calculation function. For example, in a device that implements, by means of a nonvolatile FPGA using a resistive memory element (magnetoresistive memory cell), such a lookup table (hereinafter referred to as LUT) function that a readout result of address information may be equal to a result of calculating the address information being input information according to a predetermined calculation algorithm, a reduction of 62 percent in the number of transistor elements is achieved, for example, as compared with an existing device that is configured without LIM described above.

CITATION LIST

Non Patent Literature

NPL 1: Suzuki, Lin, M. Natsui, and T. Hanyu, "A 71%-Area-Reduced Six-Input Nonvolatile Lookup-Table Circuit Using Three-Terminal Magnetic-Tunnel-Junction-Based Single-Ended Structure," Japanese Journal of Applied Physics (JJAP) vol. 52, no. 4, pp. 04CM04-1~04CM04-6, March 2013.

SUMMARY OF INVENTION

Technical Problem

The memory circuit device configured using the above LIM circuit technology can achieve downsizing of a circuit; however, further downsizing of a circuit is requested in a memory circuit device including multiple memory cells (resistance variable elements) and equipped with a function such as an LUT that requires a write circuit unit configured to write data to these memory cells and a read circuit unit configured to read data from these memory cells.

The present invention has been made in consideration of the above circumstances, and provides a memory circuit device that makes it possible to further downsize a circuit.

The present invention also provides a method for using such a memory circuit device that enables the memory circuit device to implement a data shift function (a function as a shift register).

Solution to Problem

A memory circuit device according to the present invention includes multiple memory cells that are each constituted of a resistive memory element, a write circuit unit that is configured to write data to any one of the memory cells which is designated by cell designating information, and a read circuit unit that is configured to read out, from the memory cell designated by the cell designating information, data written in the memory cell. The memory circuit device is capable of outputting a result of the readout by the read circuit unit in response to the cell designating information as a result of calculation according to a predetermined calculation algorithm in response to the cell designating information being input information. The memory circuit device has a configuration including a selection circuit unit that is shared by both of the write circuit unit and the read circuit unit and configured to select a memory cell to be activated from the multiple memory cells based on the cell designating information, and a control circuit unit that is configured to selectively enable any one of writing of data by the write circuit unit and reading of data by the read circuit unit with respect to the memory cell selected by the selection circuit unit.

According to the above configuration, when the selection circuit unit selects a memory cell to be activated based on the cell designating information in a state where the control circuit unit enables the write circuit unit to write data, the write circuit unit writes data to the memory cell selected by the selection circuit unit. On the other hand, when the selection circuit unit selects a memory cell to be activated based on the cell designating information in a state where the control circuit enables the read circuit unit to read data, the read circuit unit reads, from the memory cell selected by the selection circuit unit, data written in the memory cell.

By regulating the writing of data to the multiple memory cells by the write circuit unit, it is possible to output a result of the readout by the read circuit unit in response to the cell designating information as a result of the calculation according to the predetermined calculation algorithm in response to the cell designating information being input information.

The memory circuit device according to the present invention may have a configuration in which the control circuit unit includes: a write control circuit unit that is configured to enable, based on a write enable signal, the write circuit unit to write data to the memory cell selected by the selection circuit unit; and a read control circuit unit that is configured to enable, based on a read enable signal, the read circuit unit to read data from the memory cell selected by the selection circuit unit.

With the above configuration, when the selection circuit unit selects a memory cell to be activated based on the cell designating information in a state where the write control circuit unit enables the write circuit unit to write data based on the write enable signal, the write circuit unit writes data to the memory cell selected by the selection circuit unit. On the other hand, when the selection circuit unit selects a memory cell to be activated based on the cell designating information in a state where the read control circuit unit enables the read circuit unit to read data based on the read enable signal, the read circuit unit reads, from the memory cell selected by the selection circuit unit, data written in the memory cell.

The memory circuit device according to the present invention may have a configuration in which the selection circuit unit includes a decoder circuit unit that is configured to convert the cell designating information into a cell selection signal which corresponds to the memory cell designated by the cell designating information, and output the cell selection signal. The memory circuit device according to the present invention may have a configuration in which the control circuit unit further includes: a cell-associated write control circuit unit that is configured to allow, in response to the cell selection signal output from the decoder circuit unit, the write circuit unit to write data to the memory cell which corresponds to the cell selection signal; and a cell-associated access control circuit unit that is configured to allow, in response to the cell selection signal output from the decoder circuit unit, the read circuit unit to access the memory which corresponds to the cell selection signal.

With the above configuration, when the decoder circuit unit of the selection circuit unit outputs a cell selection signal based on the cell designating information in a state where the write control circuit enables the write circuit unit to write data based on the write enable signal, the cell-associated write control circuit allows writing of data to the memory cell which corresponds to the cell selection signal, and the write circuit unit writes data to the memory cell to which writing of data is allowed. Meanwhile, when the decoder circuit unit of the selection circuit unit outputs a cell selection signal based on the cell designating information in a state where the read control circuit unit enables the read circuit unit to read data based on the read enable signal, the cell-associated access control circuit unit allows accessing the memory cell which corresponds to the cell selection signal, and the read circuit unit reads data from the memory cell to which data access is allowed.

The memory circuit device according to the present invention may have a configuration further including: a data switching circuit unit that is configured to switch a data string to be supplied to the write circuit unit between a first data string and a second data string according to a shift control signal; and a cell designating information switching circuit unit that is configured to switch the cell designating information to be supplied to the selection circuit unit between first cell designating information and second cell designating information according to the shift control signal.

With the above configuration, it is possible to switch writing of data according to the shift control signal between writing of the first data string to the memory cell selected based on the first cell designating information and writing of the second data string to the memory cell selected based on the second cell designating information. Besides, it is also possible to switch readout of data according to the shift control signal between readout of data from the memory cell selected based on the first cell designating information and readout of data from the memory cell selected based on the second cell designating information. Thereby, the memory circuit device can selectively exhibit multiple functions such as simple functions of data store/readout function and a calculation function and a data shift function to be described later.

In the memory circuit device according to the present invention, the multiple memory cells may be each constituted of a magnetoresistive memory cell as a resistance variable element.

A method for using a memory circuit device according to the present invention is a method for using any one of the above memory circuit devices including n (n is an integer of 2 or larger) memory cells from first to n-th memory cells arranged in an array. The method has a configuration including: a cell designation step of supplying, in a state where data is written in each of the n memory cells, the selection circuit unit with cell designating information in which a memory cell designated by the cell designating information changes sequentially among the first memory cell to the n-th memory cell; and a data readout step of causing the control circuit unit to enable the read circuit unit to read data and, while a memory cell designated by the cell designating information changes sequentially among the first memory cell to the n-th memory cell, thereby causing the read circuit unit to read data from a memory cell selected by the selection circuit unit based on the cell designating information.

With the above configuration, data is read in order from the first memory cell to the n-th memory cell in the state where data is written in each of the n first to n-th memory cells. This makes it possible to output data strings written in the n memory cells one data at a time while shifting the memory cell sequentially from one memory cell to another, and thereby implement a shift register function.

A method for using a memory circuit device according to the present invention is a method for using any one of the above memory circuit devices including n (n is an integer of 2 or larger) memory cells from first to n-th memory cells arranged in an array. The method has a configuration including: a cell designation step of supplying, in a state where data is written in the n memory cells, the selection circuit unit with cell designating information in which a memory cell designated by the cell designating information changes sequentially so as to iterate over the first memory cell to the n-th memory cell; a data readout step of causing the control circuit unit to enable the read circuit unit to read data and, while a memory cell designated by the cell designating information changes so as to iterate over the first memory cell to the n-th memory cell, thereby causing the read circuit unit to read data from a memory cell selected by the selection circuit unit based on the cell designating information; and a data write step of causing the control circuit unit to enable the write circuit unit to write data instead of enabling the read circuit unit to read data every time the readout of data by the read circuit unit is over, and thereby causing the write circuit unit to write data to the memory cell selected by the selection circuit unit based on the cell designating information at the time of the readout of data.

A method for using a memory circuit device according to the present invention is a method for using a memory circuit device having a configuration in which the memory circuit device includes n (n is an integer of 2 or larger) memory cells from first to n-th memory cells arranged in an array, and the control circuit unit described above includes: the write control circuit unit that is configured to enable, based on the write enable signal as a control signal, the write circuit unit to write data to the memory cell selected by the selection circuit unit; and the read control circuit unit that is configured to enable, based on the read enable signal as a control signal, the read circuit unit to read data from the memory cell selected by the selection circuit unit. The method has a configuration including: a cell designation step of supplying, in a state where data is written in the n memory cells, the selection circuit unit with cell designating information in which a memory cell designated by the cell designating information changes sequentially so as to iterate over the first memory cell to the n-th memory cell; a data readout step of supplying the read enable signal to the read control circuit unit and, while a memory cell designated by the cell designating information changes so as to iterate over the first memory cell to the n-th memory cell, thereby causing the read circuit unit to read data from a memory cell selected by the selection circuit unit based on the cell designating information; and a data write step of supplying the write enable signal to the write control circuit unit instead of the read enable signal every time the readout of data by the read circuit unit is over, and thereby causing the write circuit unit to write data to the memory cell selected by the selection circuit unit based on the cell designating information at the time of the readout of data.

According to these configurations, data is read in order from the first memory cell to the n-th memory cell in the state where data is written in each of the n first to n-th memory cells. In this process, every time the readout of data from each memory cell is over, data is written in the memory cell from which the data has been read. As a result, once the sequential readout of data from the first memory cell to the n-th memory cell is over, the n first to n-th memory cells are put in a state of being written with new data. In this state, data is read from each memory cell and, in this process, every time the readout of data from each memory cell is over, data is written in the memory cell from which the data has been read. By iteration of this procedure, it is possible to output data strings written in the n memory cells and data strings to be then written in the first memory cell to the n-th memory cell one data at a time while shifting the memory cell sequentially from one memory cell to another, and thereby implement a shift register function.

Advantageous Effects of Invention

According to the memory circuit device of the present invention, data is written and read using the function of the selection circuit unit that is shared by both of the write circuit unit and the read circuit unit without dedicated selection circuit units provided respectively for the write circuit unit and the read circuit unit. Thus, this memory circuit device makes it possible to further downsize a circuit.

In addition, the method for using the memory circuit device according to the present invention enables the memory circuit device according to the present invention, having a configuration with a smaller circuit size as described above, to implement a data shift function, that is, a function as a shift register.

DESCRIPTION OF EMBODIMENTS

Hereinbelow, embodiments of the present invention are described using the drawings.

Figure 1:
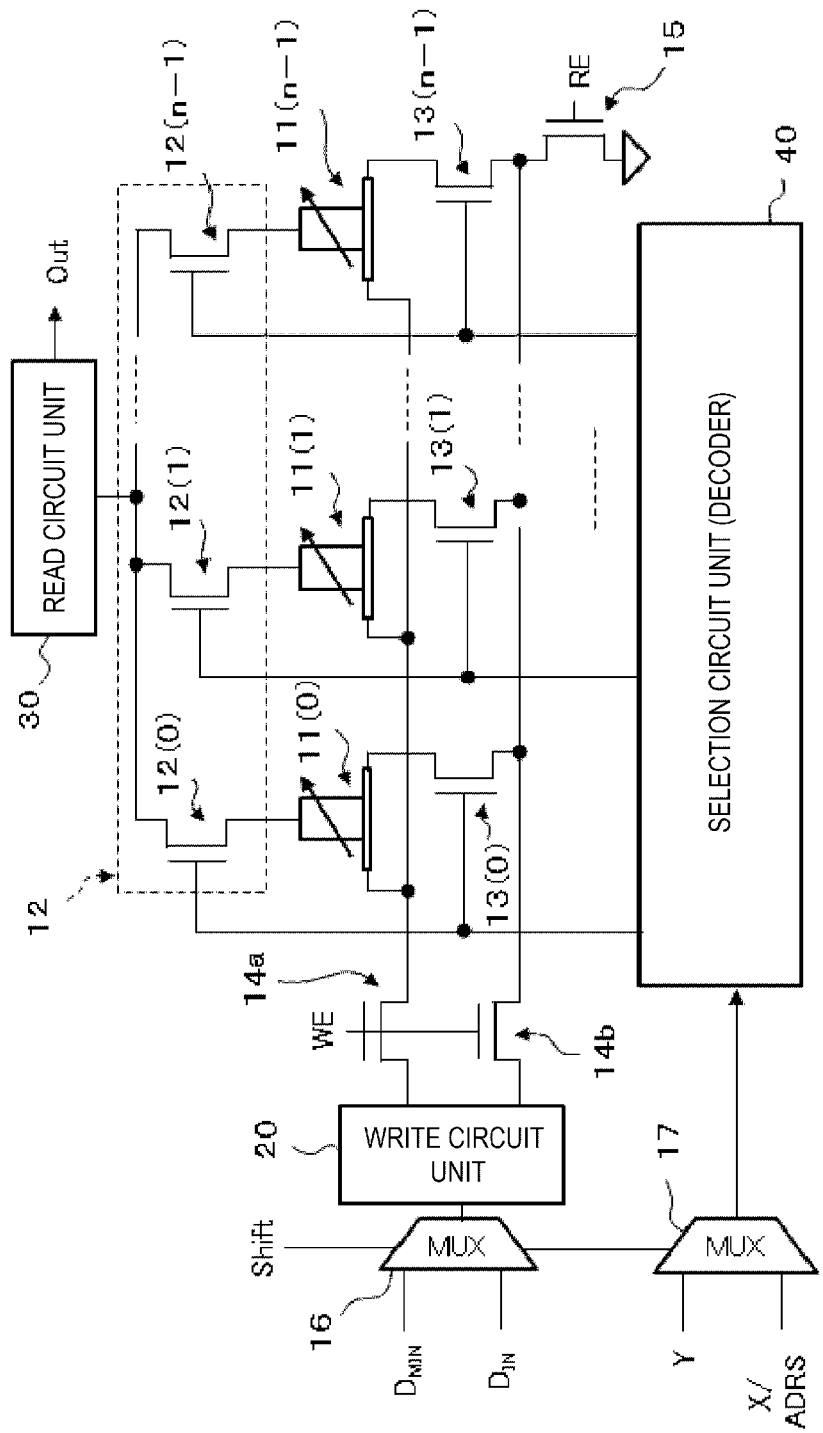
FIG. 1 is a circuit diagram illustrating a memory circuit device according to an embodiment of the present invention.

A memory circuit device according to a first embodiment of the present invention has a configuration as illustrated in FIG. 1. This memory circuit device is constituted of, for example, a nonvolatile FPGA that uses a magnetic tunnel junction (MTJ) element (magnetic tunnel junction element) as a memory cell by the logic-in-memory (LIM) circuit technology. The logic-in-memory circuit technology is a technology for minimizing the complexity of a connection network of memories and calculators or a technology for localizing communication between memories and calculators, and is described in detail in NPL 1 above.

This memory circuit device can be used as a typical memory device that reads and writes data, as a device that implements a lookup table (LUT) calculation function, and as a device (shift register) that implements a shift function of sequentially shifting input data.

Figure 2A:
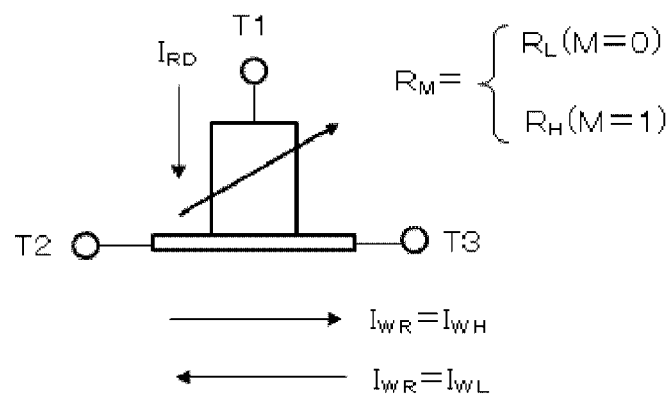
FIG. 2A is a diagram illustrating a three-terminal MTJ element.

In FIG. 1, this memory circuit device includes n (n is an integer of 2 or larger) memory cells 11 from the first memory cell 11(0) to the n-th memory cell 11(n-1) (the collectively-called "memory cell" is assigned a reference number of "11") each of which is constituted of an MTJ element (resistive memory element). Each memory cell 11 is constituted of a three-terminal MTJ element. As illustrated in FIG. 2A, the three-terminal MTJ element has one read terminal T1 and two write terminals T2 and T3. When write current $I_{WR}$ (high-resistance current $I_{WH}$) flows from the write terminal T2 toward the write terminal T3, the element becomes at a high resistance value $R_H$. Adversely, when write current $I_{WR}$ (low-resistance current $I_{WL}$) flows from the write terminal T3 toward the write terminal T2, the element becomes at a low resistance value $R_L$. For example, defining that the high resistance value $R_H$ is data "1" (M=1) and the low resistance value $R_L$ is data "0" (M=0), data (0 or 1) corresponding to the flow direction of the write current $I_{WR}$ is written to the element. On the other hand, when read current $I_{RD}$ flows to the read terminal T1 (and flows out through the terminal T3, for example), voltage drop occurs according to the resistance value of the element (low resistance $R_L$, high resistance $R_H$). By detecting this voltage drop, it is possible to read out data (0 or 1) written in the element.

Figure 2B:
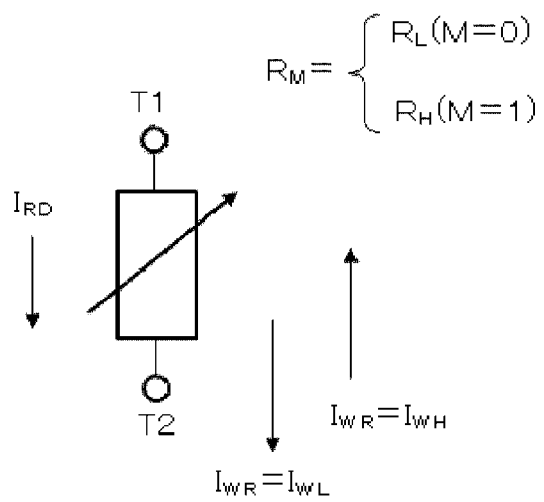
FIG. 2B is a diagram illustrating a two-terminal MTJ element.

In addition to the three-terminal MTJ element described above, a two-terminal MTJ element as illustrated in FIG. 2B can also be used as a memory cell. The two-terminal MTJ element has two terminals T1 and T2. When write current $I_{WR}$ (low-resistance current $I_{WL}$) flows from the terminal T1 toward the terminal T2, the element becomes at a low resistance value $R_L$. Adversely, when write current $I_{WR}$ (high-resistance current $I_{WH}$) flows from the terminal T2 toward the terminal T1, the element becomes at a high resistance value $R_H$. In this case also, data (0 or 1) corresponding to the resistance value (low resistance $R_L$, high resistance $R_H$) is written to the element. When read current $I_{RD}$ flows from the terminal T1, voltage drop occurs according to the resistance value of the element (low resistance $R_L$, high resistance $R_H$). By detecting this voltage drop, it is possible to read out data (0 or 1) written in the element.

The memory circuit device using the two-terminal MTJ element is to be described later as a second embodiment of the present invention (see FIG. 10).

Returning back to FIG. 1, in addition to the n memory cells 11(0) to 11(n-1) described above, this memory circuit device has: a write circuit unit 20; a read circuit unit 30; and a selection circuit unit 40 that is shared by both of the write circuit unit 20 and the read circuit unit 30. This memory circuit device also has, as a control circuit unit: write control transistors (NMOS type) 14a and 14b (write control circuit unit); a read control transistor 15 (read control circuit unit); write control transistors (NMOS type) 13(0) to 13(n-1) (cell-associated write control circuit unit) that are associated with the n memory cells 11(0) to 11(n-1); and an access transistor array 12 for allowing the read circuit unit 30 to access the memory cells 11. The access transistor array 12 is constituted of access transistors 12(0) to 12(n-1) (cell-associated access control circuit unit) that are associated with the n memory cells 11(0) to 11(n-1). The memory circuit device further has two switching circuit units (MUX) that are configured to perform switching operations according to a shift control signal (Shift). One of the switching circuit units is a data switching circuit unit (MUX) 16 that is configured to switch data to be supplied to the write circuit unit 20 between data for shift $D_{MIN}$ (first data string) and data for storage $D_{IN}$ (second data string) according to the shift control signal (Shift). Meanwhile, the other is a cell designating information switching circuit unit (MUX) 17 that is configured to switch cell designating information (information for designating a memory cell) to be supplied to the selection circuit unit 40 between shift cell designating information Y (first cell designating information) and LUT/memory cell designating information X/ADRS (second cell designating information) according to the shift control signal (Shift).

Each of the access transistors 12(0) to 12(n-1) is connected to a read terminal of the corresponding one of the memory cells 11(0) to 11(n-1) (three-terminal MTJ element: see FIG. 2A) and a read connection terminal of the read circuit unit 30. In addition, two write lines extend from the write circuit unit 20, and the write lines are respectively provided with the write control transistors 14a and 14b. A write enable signal (WE) is input to each of the gates of these transistors 14a and 14b, and the transistors 14a and 14b get turned on based on the write enable signal (WE) and allow write current $I_{WR}$ to flow from the write circuit unit 20 to the two write lines. This enables the write circuit unit 20 to write data to the memory cells 11(0) to 11(0) (three-terminal MTJ element). One of the write terminals of each of the memory cells 11(0) to 11(n-1) (see FIG. 2A) is connected to one of the write lines, while the other write terminal (see FIG. 2A) is connected to the other write line via the corresponding one of the write control transistors 13(0) to 13(n-1).

The write line extending from the write circuit unit 20 and provided with the write control transistor 14b is used as a current line at the time of reading data, and the read control transistor 15 is connected to this current line and a ground terminal. A read enable signal (RE) is input to the gate of the transistor 15, and the transistor 15 gets turned on based on the read enable signal (RE) and sets the current line, to which the transistors 13(0) to 13(n-1) are connected, at a ground level. This enables read current $I_{RD}$, which is output from the read circuit unit 30, to flow via the access transistors 12(0) to 12(n-1), the memory cells 11(0) to 11(n-1) and the transistors 13(0) to 13(n-1) and thus enables data reading from the memory cells 11(0) to 11(n-1).

Selection signal lines associated respectively with the n memory cells 11(0) to 11(n-1) extend from the selection circuit unit 40, and each of the selection signal lines is connected to the gate of the access transistor 12(i) provided for the corresponding memory cell 11(i) and to the gate of the corresponding transistor 13(i). The selection circuit unit 40 outputs a cell selection signal through the selection signal line that is associated with the memory cell 11(i) which is selected, as a memory cell to be activated, based on cell designating information input via the cell designating information switching circuit unit 17. Then, by the cell selection signal that is output from the selection circuit unit 40 through the selection signal line associated with the memory cell 11(i) to be activated, the corresponding access transistor 12(i) and transistor 13(i) get turned on, which enables the write circuit unit 20 to write data to the memory cell 11(i) and enables the read circuit unit 30 to read data from the memory cell (i).

A specific configuration of the selection circuit unit 40 is to be described later.

Figure 3:
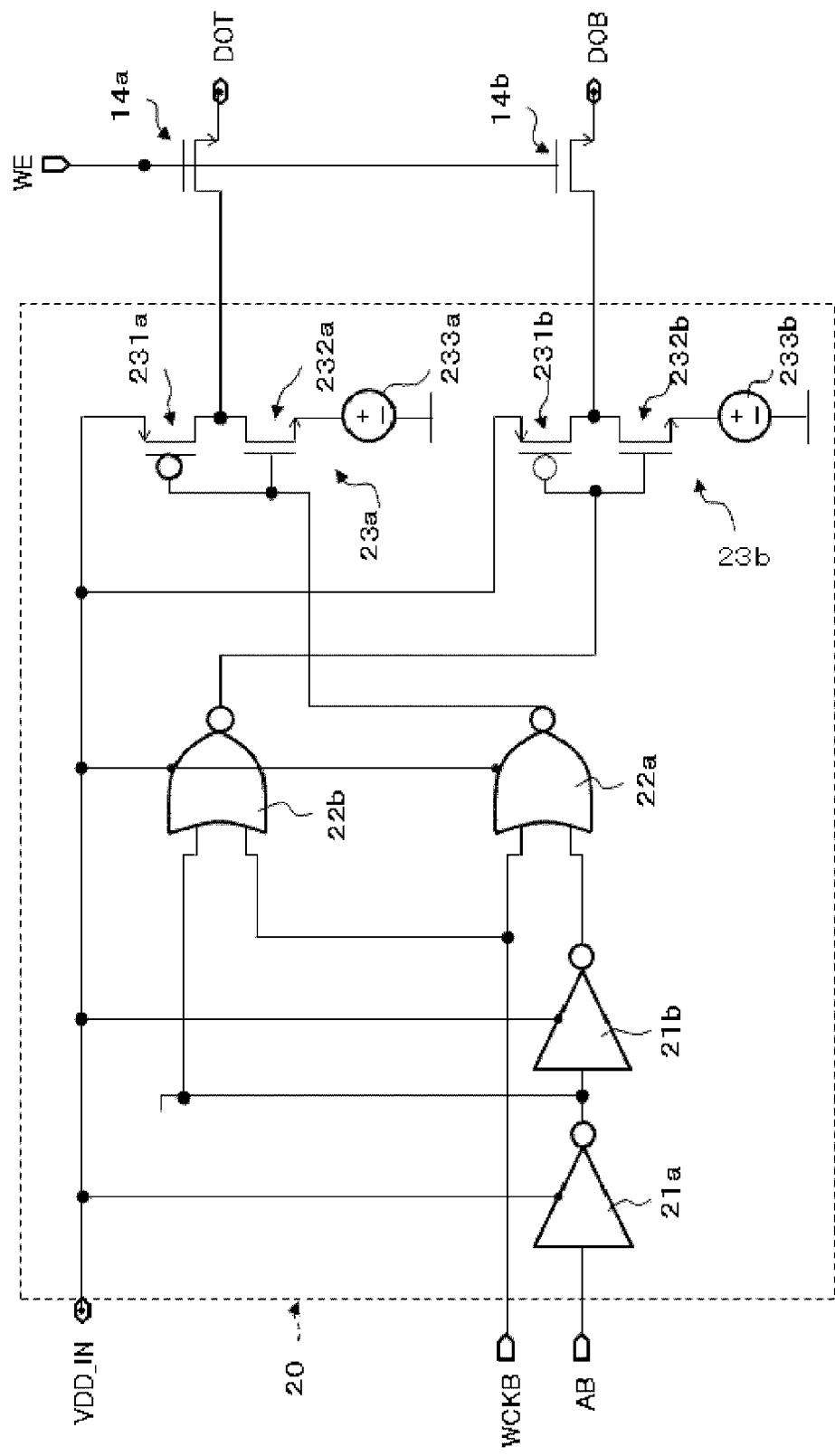
FIG. 3 is a circuit diagram illustrating a configuration example of a write circuit unit in the memory circuit device illustrated in FIG. 1.

First, the write circuit unit 20 has a configuration as illustrated in FIG. 3.

In FIG. 3, the write circuit unit 20 includes: a first current supply circuit 23a; a second current supply circuit 23b; and two NOT gates 21a and 21b and two NOR gates 22a and 22b as a control circuit. The first current supply circuit 23a has a configuration such that a PMOS transistor 231a, an NMOS transistor 232a, and a constant voltage source 233a are connected in series between a power input terminal VDD_IN and a ground. As with the first current supply circuit 23a, the second current supply circuit 23b also has a configuration such that a PMOS transistor 231b, an NMOS transistor 232b, and a constant voltage source 233b are connected in series between the power input terminal VDD_IN and a ground. The write line provided with the write control transistor 14a described above extends through a terminal DOT from a connection point between the transistor 231a (D terminal) and the transistor 232a (D terminal) of the first current supply circuit 23a. Meanwhile, the write line provided with the write control transistor 14b extends through a terminal DOB from a connection point between the transistor 231*b* (D terminal) and the transistor 232*b* (D terminal) of the second current supply circuit 23*b*.

The two NOR gates 22*a* and 22*b* become active when a control signal WCKB is "0". When data "1" (H level) is input to an input terminal AB in this state, an H level signal having passed through the two NOT gates 21*a* and 21*b* is then inverted into an L level signal by the NOR gate 22*a*, and is input to the gates of the transistors 231*a* and 232*a* of the first current supply circuit 23*a*. At this time, a signal having turned into an L level signal through the NOT gate 21*a* is then inverted into an H level signal by the NOR gate 22*b*, and is input to the gates of the transistors 231*b* and 232*b* of the second current supply circuit 23*b*. Thereby, in the first current supply circuit 23*a*, the transistor 231*a* (PMOS type) turns on and the transistor 232*a* (NMOS type) turns off, respectively; in the second current supply circuit 23*b*, the transistor 231*b* (PMOS type) turns off and the transistor 232*b* (NMOS type) turns on, respectively. As a result, write current $I_{WR}$ output from the first current supply circuit 23*a* flows through the write line, which is provided with the transistor 14*a*, via the terminal DOT, and is drawn into the second current supply circuit 23*b* via the DOB. Thus, data "1" is written to the selected memory cell.

On the other hand, when data "0" (L level) is input to the input terminal AB, an L level signal having passed through the two NOT gates 21*a* and 21*b* is then inverted into an H level signal by the NOR gate 22*a*, and is input to the gates of the transistors 231*a* and 232*a* of the first current supply circuit 23*a*. At this time, a signal having turned into an H level signal through the NOT gate 21*a* is then inverted into an L level signal by the NOR gate 22*b*, and is input to the gates of the transistors 231*b* and 232*b* of the second current supply circuit 23*b*. Thereby, in the first current supply circuit 23*a*, the transistor 231*a* (PMOS type) turns off and the transistor 232*a* (NMOS type) turns on, respectively; in the second current supply circuit 23*b*, the transistor 231*b* (PMOS type) turns on and the transistor 232*b* (NMOS type) turns off, respectively. As a result, write current $I_{WR}$ output from the second current supply circuit 23*b* flows through the write line, which is provided with the transistor 14*b*, via the terminal DOB, and is drawn into the first current supply circuit 23*a* via the DOT. Thus, data "0" is written to the selected memory cell.

Figure 4:
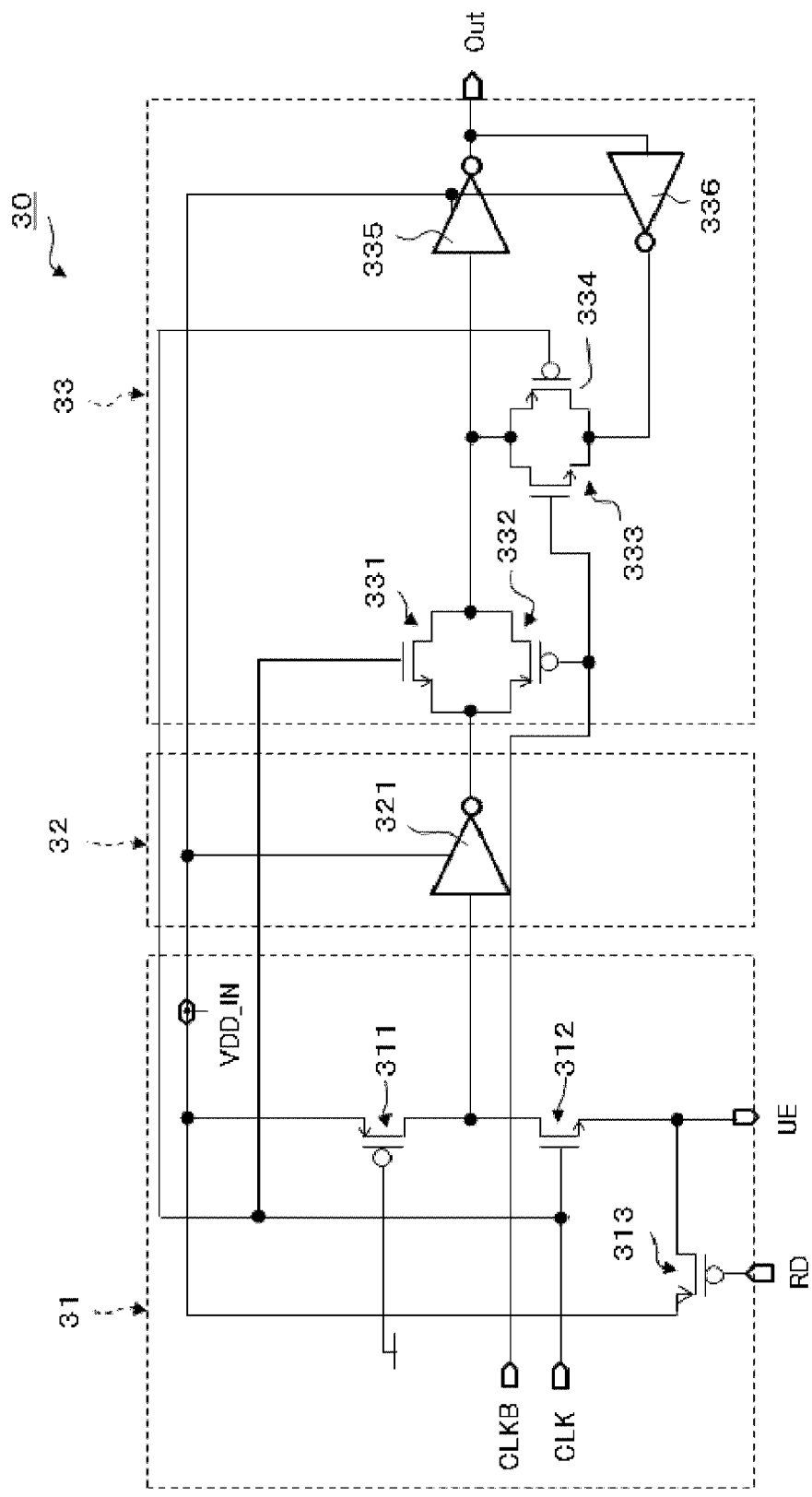
FIG. 4 is a circuit diagram illustrating a configuration example of a read circuit unit in the memory circuit device illustrated in FIG. 1.

Next, the read circuit unit 30 has a configuration as illustrated in FIG. 4.

In FIG. 4, the read circuit unit 30 includes: a resistance division unit 31; an inversion unit 32; and a latch unit 33. In the resistance division unit 31, a PMOS transistor 311 and an NMOS transistor 312 are connected in series between a power input terminal VDD_IN and a read connection terminal UE. The transistor 311 having a gate connected to a ground is constantly set at ON and functions as a load resistor. A clock signal for synchronizing a read operation, which is supplied via a terminal CLK, is input to the gate of the transistor 312, and this transistor 312 repeats an ON/OFF operation (switching operation) in synchronization with the clock signal.

As described previously (see FIG. 1), the read connection terminal UE is connected to the read terminals of the memory cells 11(0) to 11(*n*-1) via the respective access transistors 12(0) to 12(*n*-1). Thus, when the transistor 312 gets turned on, read current $I_{RD}$ flows from a power supply VDD by way of the transistor 311, the transistor 312, and the access transistor 12(*i*), which gets turned on by the cell selection signal, to the corresponding memory cell 11(*i*). Thereby, power supply voltage VDD is divided by resistance (low resistance, high resistance) corresponding to data (0 or 1) written in the memory cell 11(*i*) and the load resistance of the transistor 311, and the divided voltage (hereinafter referred to as read voltage) appears at a connection point between the transistor 311 (D terminal) and the transistor 312 (D terminal). Since the load resistance of the transistor 311 is constant, the read voltage (divided voltage) corresponds to the data (high resistance, low resistance) written in the memory cell 11(*i*).

Between the power input terminal VDD_IN and the read connection terminal UE, a PMOS transistor 313 is connected in parallel with the series circuit of the two transistors 311 and 312 described above. A control signal RD which becomes at the H level (=1) during the read operation is input to the gate of this transistor 313. When this control signal RD is at the L level (RD=0), the transistor 313 turns on and the read connection terminal UE is kept at the H level (power supply voltage VDD). Thereby, while no read operation is performed (RD=0), the access transistors 12(0) to 12(*n*-1) (on the D terminal side) of the access transistor array 12 connected to the read connection terminal UE are precharged. This makes it possible to improve the processing speed at the time of reading data (RD=1) from the memory cell 11(*i*) via the corresponding access transistor 12(*i*).

The inversion unit 32 is constituted of an inversion circuit 321. The above-described read voltage of the resistance division unit 31 corresponding to the data (0: low resistance, 1: high resistance) written in the memory cell 11 is input to the inversion circuit 321, and this read voltage is inverted and amplified by the inversion circuit 321 and supplied to the latch unit 33. Meanwhile, the latch unit 33 has a configuration such that a circuit unit, constituted of an NMOS transistor 331 and a PMOS transistor 322, and an NOT gate 335 are connected in series, and the output of the NOT gate 335 is fed back to the input of the NOT gate 335 via an NOT gate 336 and a circuit unit constituted of an NMOS transistor 333 and a PMOS transistor 334. A clock signal CLK supplied via the terminal CLK is input to the gate of the transistor 331 (NMOS type) and the gate of the transistor 334 (PMOS type), and a clock signal CLKB supplied via a terminal CLKB is input to the gate of the transistor 332 (PMOS type) and the gate of the transistor 333 (NMOS type).

The read circuit unit 30 having the above configuration operates in synchronization with the clock signal CKL and the clock signal CLKB. Specifically, when the clock signal CLK=1 and the clock signal CLKB=0, the resistance value (low resistance, high resistance) of the memory cell 11 (MTJ element) i.e. the read voltage corresponding to the data (0, 1) written in the memory cell 11 appears at the connection point between the transistor 311 (D terminal) as the load resistor and the transistor 312 (D terminal) for switching of the resistance division unit 31, and this read voltage is inverted and amplified by the inversion circuit 321 of the inversion unit 32. Meanwhile, when the clock signal CLK=0 and the clock signal CLKB=1, the output voltage of the inversion circuit 321 is held by the latch unit 33, and the held voltage that is at the level (L, H) corresponding to the data (0, 1) written in the memory cell 11 is output from an output terminal Out.

Figure 5:
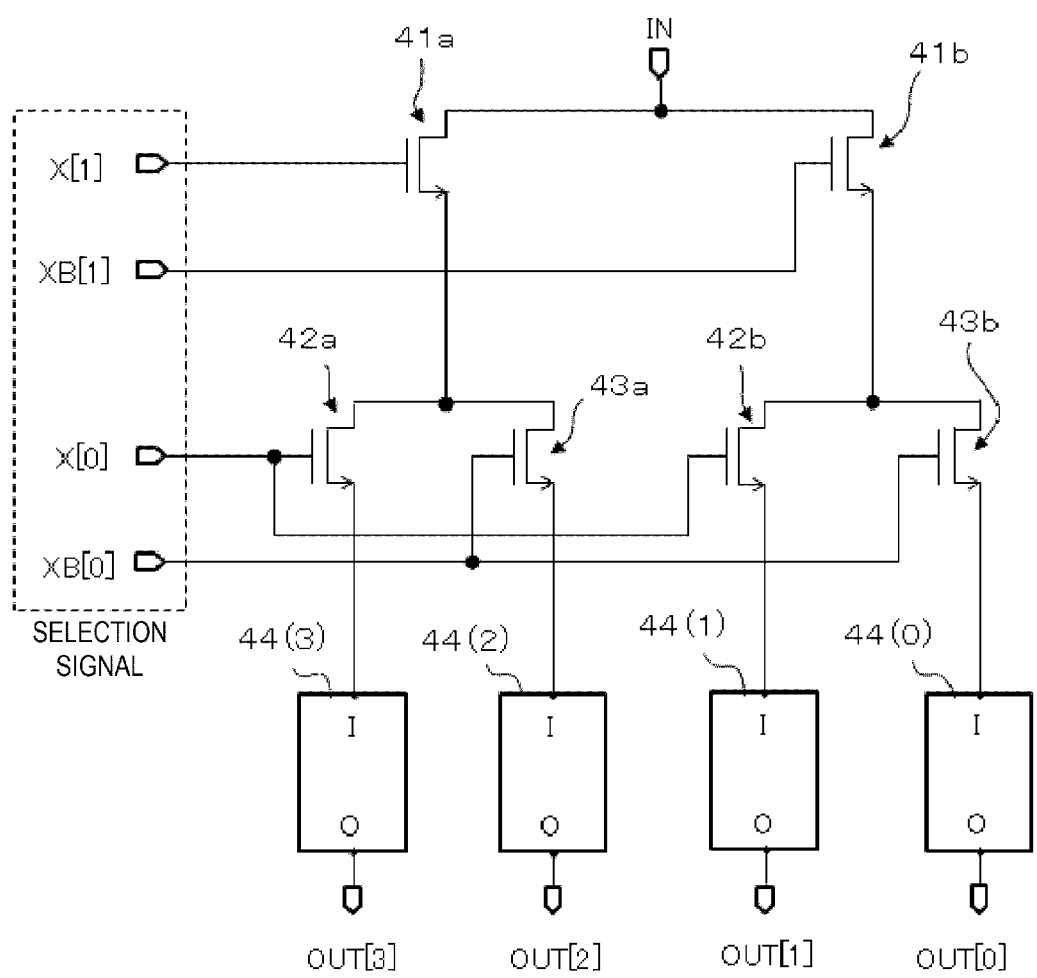
FIG. 5 is a circuit diagram illustrating a configuration example of a selection circuit unit in the memory circuit device illustrated in FIG. 1.

Next, the selection circuit unit 40 has a configuration as illustrated in FIG. 5. For example, the selection circuit unit 40 illustrated in FIG. 5 has a configuration corresponding to four (n=4) memory cells of the first memory cell 11(0), the second memory cell 11(1), the third memory cell 11(2), and the fourth memory cell 11(3).

Cell designating information (address information) that is input to the selection circuit unit 40 via the cell designating information switching circuit unit 17 is represented by 2 bits. For example, cell designating information "00" designates the first memory cell 11(0), cell designating information "01" designates the second memory cell 11(1), cell designating information "10" designates the third cell memory 11(2), and cell designating information "11" designates the fourth memory cell 11(3). This selection circuit unit 40 is configured as a decoder circuit unit that is configured to convert cell designating information, which designates a memory cell, into a cell selection signal that activates this memory cell.

Figure 6:
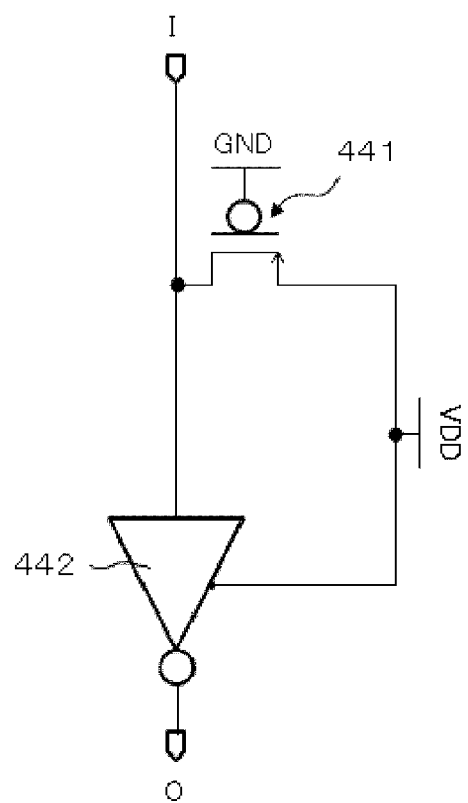
FIG. 6 is a circuit diagram illustrating a configuration example of an output circuit in the selection circuit unit illustrated in FIG. 4.

In FIG. 5, this selection circuit unit 40 has four output circuits 44(0), 44(1), 44(2), and 44(3) that correspond respectively to the four memory cells 11(0) to 11(3). As illustrated in FIG. 6, each of the output circuits 44(0) to 44(3) includes: an inversion circuit 442; and a PMOS transistor 441 that is located between the input (input terminal I) of the inversion circuit 442 and a power supply VDD. The gate of the transistor 441 is connected to a ground, and this transistor 441 is constantly set at ON. Thus, the output of the inversion circuit 442 i.e. an output terminal O is normally kept at the L level by power supply voltage VDD.

Returning back to FIG. 5, this selection circuit unit 40 has two NMOS transistors 41a and 41b and four NMOS transistors 42a, 43a, 42b, and 43b that are connected in a tree shape. The transistor 41a gets turned on or off by a selection signal input to an input port X[1], and the transistor 41b gets turned on or off by a selection signal input to an input port XB[1]. Meanwhile, the transistors 42a and 42b get turned on or off by a selection signal input to an input port X[0], and the transistors 43a and 43b get turned on or off by a selection signal input to an input port XB[0].

The 2-bit cell designating information that designates any of the memory cells 11(0) to 11(3) is converted into four selection signals and input to the four input ports X[1], XB[1], X[0], and XB[0] as follows.

The cell designating information "00" that designates the first memory cell 11(0) is converted into X[1]=0, XB[1]=1, X[0]=0, XB[0]=1, the cell designating information "01" that designates the second memory cell 11(1) is converted into X[1]=0, XB[1]=1, X[0]=1, XB[0]=0, the cell designating information "10" that designates the third memory cell 11(2) is converted into X[1]=1, XB[1]=0, X[0]=0, XB[0]=1, and the cell designating information "11" that designates the fourth memory cell 11(3) is converted into X[1]=1, XB[1]=0, X[0]=1, XB[0]=0.

When the selection circuit unit 40 is in the decoding operation, an L-level signal is input to an input terminal IN (IN=0). In this state, when the cell designating information "00" that designates the first memory cell 11(0) is supplied to the selection circuit unit 40, the selection signals X[1]=0, XB[1]=1, X[0]=0, XB[0]=1 are input to the four input ports X[1], XB[1], X[0], and XB[0]. Thereby, the transistor 41b gets turned on, the transistors 43a and 43b get turned on, and all the remaining transistors are kept at OFF. As a result, the input terminal I of the output circuit 44(0) that is associated with the first memory cell 11(0) is brought into the L level through the transistors 41b and 43b, and an H-level cell selection signal is output from the output terminal O of the output circuit 44(0) of the inversion circuit 442 (see FIG. 6).

When the cell designating information "01" that designates the second memory cell 11(1) is supplied to the selection circuit unit 40, the selection signals X[1]=0, XB[1]=1, X[0]=1, XB[0]=0 are input to the four input ports X[1], XB[1], X[0], and XB[0]. Thereby, the transistor 41b gets turned on, the transistors 42a and 42b get turned on, and all the remaining transistors are kept at OFF. As a result, the input terminal I of the output circuit 44(1) that is associated with the second memory cell 11(1) is brought into the L level through the transistors 41b and 42b, and an H-level cell selection signal is output from the output terminal O of the output circuit 44(1) of the inversion circuit 442 (see FIG. 6).

When the cell designating information "10" that designates the third memory cell 11(2) is supplied to the selection circuit unit 40, the selection signals X[1]=1, XB[1]=0, X[0]=0, XB[0]=1 are input to the four input ports X[1], XB[1], X[0], and XB[0]. Thereby, the transistor 41a gets turned on, the transistors 43a and 43b get turned on, and all the remaining transistors are kept at OFF. As a result, the input terminal I of the output circuit 44(2) that is associated with the third memory cell 11(2) is brought into the L level through the transistors 41a and 43a, and an H-level cell selection signal is output from the output terminal O of the output circuit 44(2) of the inversion circuit 442 (see FIG. 6).

When the cell designating information "11" that designates the fourth memory cell 11(3) is supplied to the selection circuit unit 40, the selection signals X[1]=1, XB[1]=0, X[0]=1, XB[0]=0 are input to the four input ports X[1], XB[1], X[0], and XB[0]. Thereby, the transistor 41a gets turned on, the transistors 42a and 42b get turned on, and all the remaining transistors are kept at OFF. As a result, the input terminal I of the output circuit 44(3) that is associated with the fourth memory cell 11(3) is brought into the L level through the transistors 41a and 42a, and an H-level cell selection signal is output from the output terminal O of the output circuit 44(3) of the inversion circuit 442 (see FIG. 6).

The cell selection signal (H level) output from the output circuit 44(i) (i=0, 1, 2, 3) is supplied to the gate of the access transistor 12(i) and the gate of the transistor 13(i) associated with the i-th memory cell 11(i) through the selection signal line associated with the i-th memory cell 11(i) and turns on the access transistor 12(i) and the transistor 13(i), as described previously. This enables the write circuit unit 20 to write data to the i-th memory cell 11(i) and enables the read circuit unit 30 to read data from the i-th memory cell 11(i).

The operation of the above memory circuit device is described.

Figure 7:
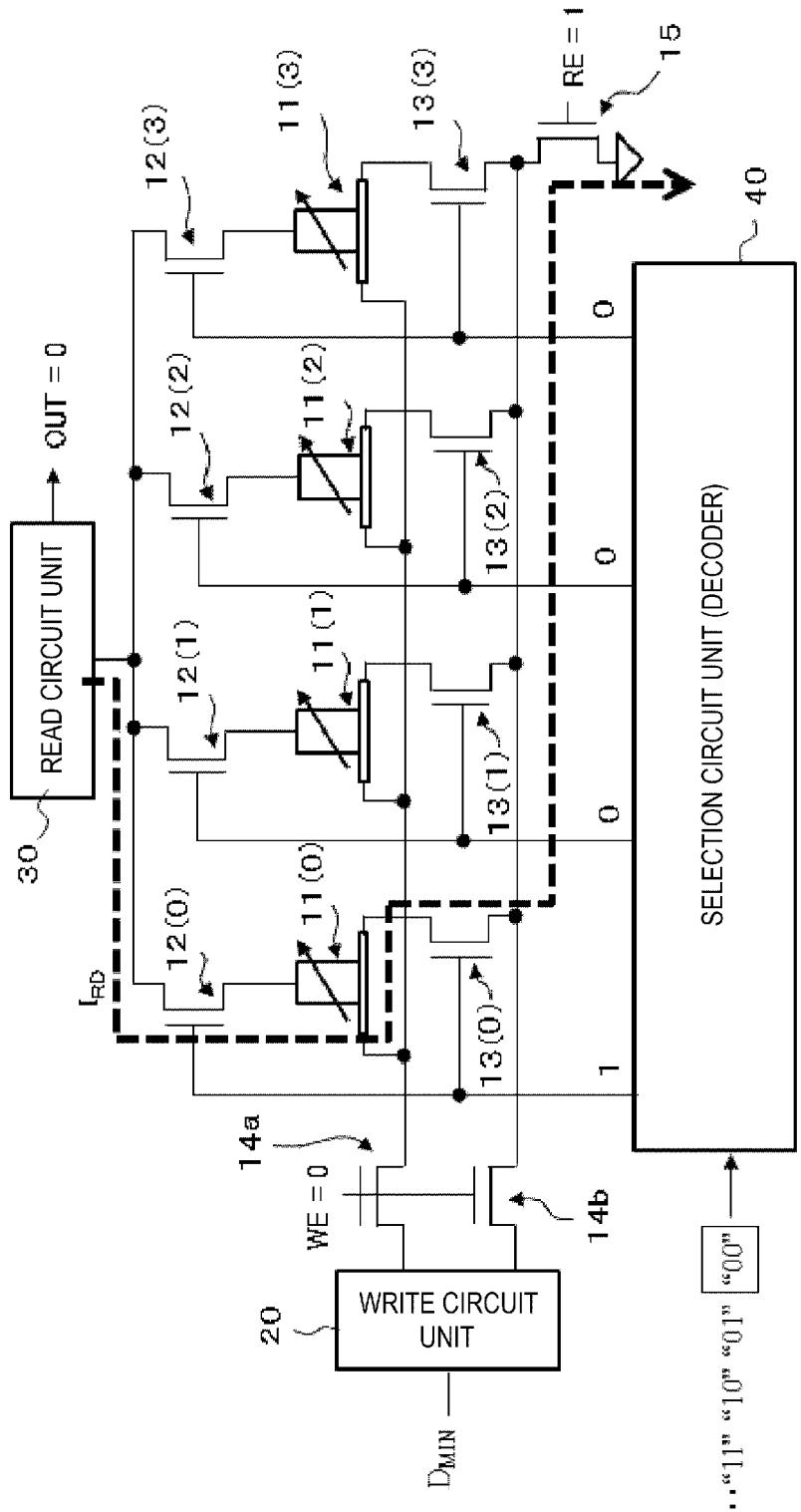
FIG. 7 is an explanatory diagram of a shift operation (read) in the memory circuit device according to the embodiment of the present invention.
Figure 8:
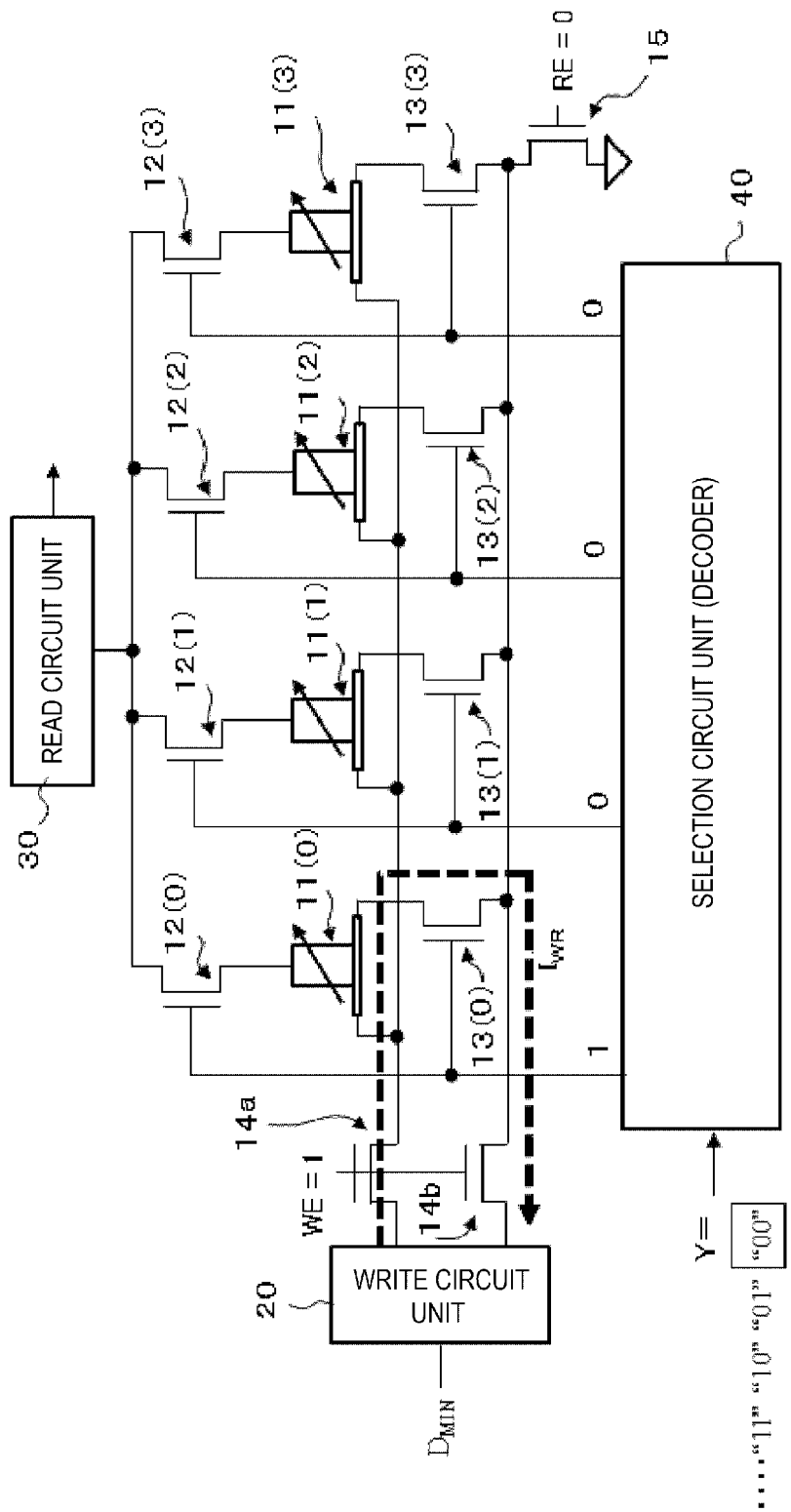
FIG. 8 is an explanatory diagram of a shift operation (write) in the memory circuit device according to the embodiment of the present invention.
Figure 9:
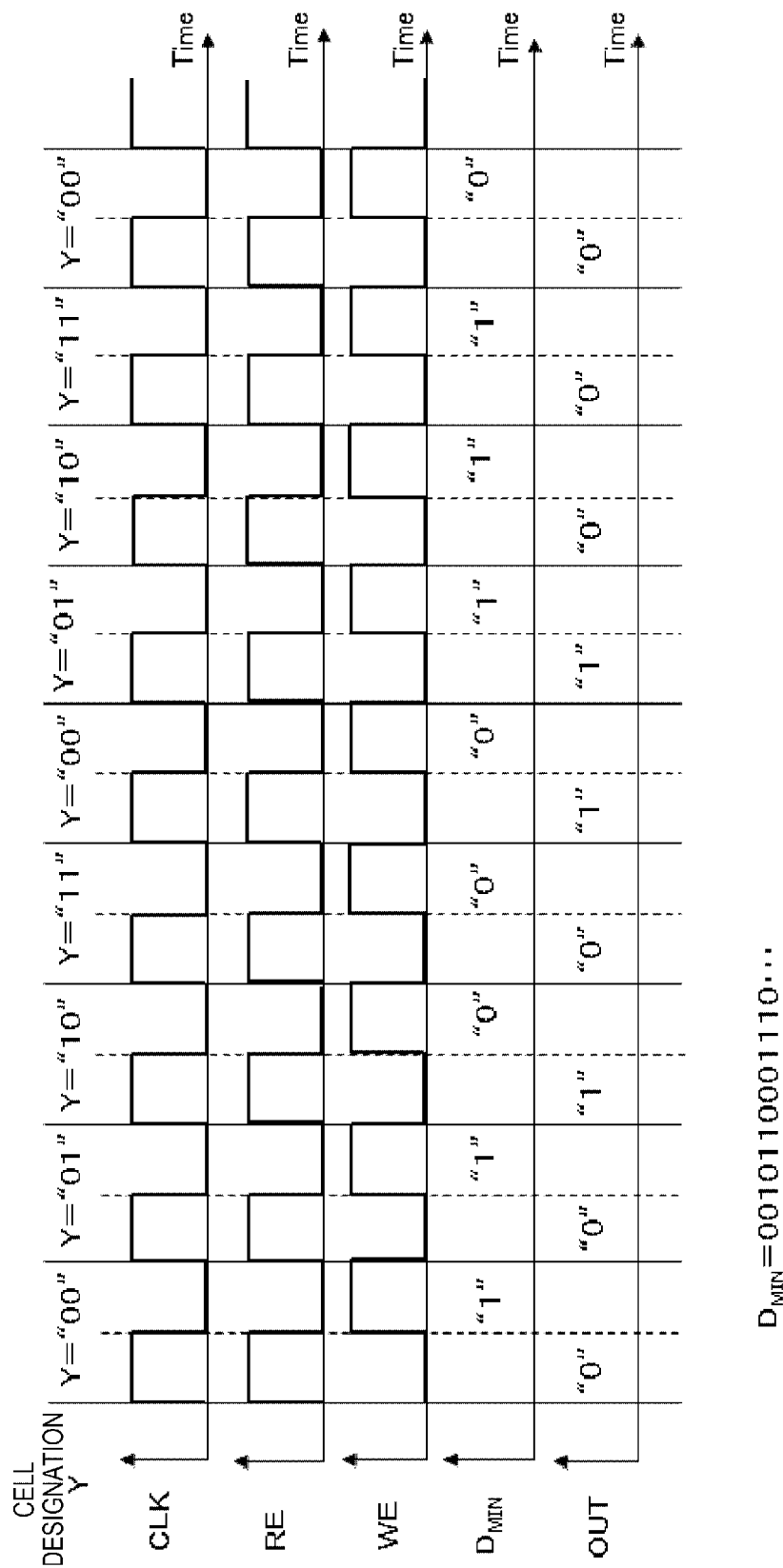
FIG. 9 is a timing chart illustrating the shift operation in the memory circuit device according to the embodiment of the present invention.

First, with reference to FIGS. 7 to 9, a description is given of the operation of the memory circuit device, having the four memory cells 11(0) to 11(3), as a device (shift register) implementing a shift function of sequentially shifting input data.

By the shift control signal (Shift), data for shift $D_{MIN}$ is supplied to the write circuit unit 20 via the data switching circuit unit 16 (see FIG. 1), and 2-bit cell designating information Y is supplied to the selection circuit unit 40 via the cell designating information switching circuit unit 17 (see FIG. 1). For example, assume a case where shift input data $D_{MIN}$ is "0010110001110 . . . " and, in an initial state, initial four bits "0010" are written in the first memory cell 11(0) to the fourth memory cell 11(3).

In this state, as illustrated in FIG. 9, cell designating information Y is supplied to the selection circuit unit 40 while changing so as to iterate over "00", "01", "10", and "11" in synchronization with a predetermined clock signal CLK (cell designation step). Once cell designating information Y=00 is supplied to the selection circuit unit 40, firstly a read enable signal RE is activated (RE=1), whereby the read control transistor 15 gets turned on. In this state, the cell designating information Y=00 is converted into a cell selection signal (H level) for the first memory cell 11(0) by the selection circuit unit 40 (decoder circuit unit), and this cell selection signal turns on the access transistor 12(0) and the transistor 13(0) that are associated with the first memory cell 11(0). Then, as represented by a thick broken line illustrated in FIG. 7, read current $I_{RD}$ output from the read circuit unit 30 flows through the access transistor 12(0), the first memory cell 11(0) (MTJ element), the transistor 13(0), and the read control transistor 15. As a result, the first bit "0" (corresponding to low resistance) of the input data $D_{MIN}$ written in the first memory cell 11(0) is read out by the read circuit unit 30, and this bit "0" thus read out is output from the output terminal OUT (data readout step).

Next, the read enable signal RE is fallen down (RE=0) and the write enable signal WE is activated (WE=1), whereby the two write control transistors 14a and 14b get turned on. In this state, the selection circuit unit 40 keeps outputting the cell selection signal for the first memory cell 11(0) that corresponds to the cell designating information Y=00, whereby the transistor 13(0) is kept turned on. Then, write current $I_{WR}$ that corresponds to the fifth bit "1" of the input data $D_{MIN}$ is output from the write circuit unit 20 and, as represented by a thick broken line illustrated in FIG. 8, this write current $I_{WR}$ flows through the write control transistor 14a, the first memory cell 11(0) (MTJ element), the transistor 13(0), and the write control transistor 14b and returns back to the write circuit unit 20. As a result, the fifth bit "1" is written to the first memory cell 11(0) by the write current $I_{WR}$ in replacement of the first bit "0" of the input data $D_{MIN}$ (data write step).

Subsequently, as represented by the timing chart illustrated in FIG. 9, while the cell designating information Y to be supplied to the selection circuit unit 40 changes with iteration, the second bit "0" of the input data $D_{MIN}$ that is written in the second memory cell 11(1) designated by the cell designating information Y=01 is read out by the read circuit unit 30, and the sixth bit "1" of the input data $D_{MIN}$ is written to the second memory cell 11(1) by the write circuit unit 20 in replacement of this second bit "0". Then, the third bit "1" of the input data $D_{MIN}$ that is written to the third memory cell 11(2) designated by the cell designating information Y=10 is read out by the read circuit unit 30, and the seventh bit "0" of the input data $D_{MIN}$ is written to the third memory cell 11(2) by the write circuit unit 20 in replacement of this third bit "1". Further, the fourth bit "0" of the input data $D_{MIN}$ that is written in the fourth memory cell 11(3) designated by the cell designating information Y=11 is read out by the read circuit unit 30, and the eighth bit "0" of the input data $D_{MIN}$ is written to the fourth memory cell 11(3) by the write circuit unit 20 in replacement of this fourth bit "0".

By repeating the above operation, the input data $D_{MIN}$ is output from the read circuit unit 30 while being shifted one bit at a time. This implements a shift register function of shifting the input data $D_{MIN}$ one bit at a time.

Next, a description is given of the operation of the above memory circuit device as a typical memory device that reads and writes data.

In this case, by the shift control signal (Shift), write data $D_{IN}$ is supplied to the write circuit unit 20 via the data switching circuit unit 16, and address information ADRS is supplied as cell designating information to the selection circuit unit 40 via the cell designating information switching circuit unit 17. Thereby, as in the case of the shift operation described above, in the state where the write enable signal WE is activated (WE=1), the write data $D_{IN}$ is written one bit at a time by the write circuit unit 20 to the memory cell 11 that is selected by the selection circuit unit 40 based on the provided address information ADRS. In addition, in the state where the read enable signal RE is activated (RE=1), data that is written in the memory cell selected by the selection circuit unit 40 based on the provided address information ADRS is readout one bit at a time from this memory cell.

Next, a description is given of the operation of the above memory circuit device as a device that implements the lookup table (LUT) calculation function.

Based on the relationship between input information X and a result of calculation of this input information X according to a predetermined calculation algorithm, the input information X is supplied to the selection circuit unit 40 as address information ADRS (cell designating information), and data representing the result of calculation of the input information X is supplied to the write circuit unit 20 as write data $D_{IN}$ in response to the address information ADRS that corresponds to the input information X. For example, based on the relationship between input information X and a result of addition according to a calculation algorithm for obtaining a result of addition (A+B) of parts obtained by dividing the input information X into two (e.g. A and B), the input information X is input to the selection circuit unit 40 as address information ADRS, and data representing the result of addition of A and B constituting the input information X is supplied to the write circuit unit 20 as write data $D_{IN}$ in response to the address information ADRS that corresponds to the input information X. Thereby, in the state where the write enable signal WE is activated (WE=1), the write data $D_{IN}$ is written one bit at a time by the write circuit unit 20 to the memory cell 11 that is selected by the selection circuit unit 40 based on the provided address information ADR. In the memory circuit device with the above state, a result of readout by the read circuit unit 30 in response to the address information ADRS (cell designating information) is output as the result of calculation (e.g. the calculation result A+B) of the input information X (e.g. A and B) according to the predetermined calculation algorithm (e.g. addition algorithm) (LUT function).

In the memory circuit device described above, data is written and read using the function of the selection circuit unit 40 that is shared by both of the write circuit unit 20 and the read circuit unit 30 without dedicated selection circuit units 40 provided respectively for the write circuit unit 20 and the read circuit unit 30. Thus, this memory circuit device makes it possible to further downsize a circuit.

Further, the above memory circuit device can be used as a device that implements a shift register function by repeating reading and writing of data while sequentially changing a memory cell to be designated. Since the above memory circuit device repeats reading and writing of data one bit at a time unlike a typical shift register that rewrites all bits every time the device reads one bit, this device makes it possible to reduce power consumption.

The above memory circuit device uses a three-terminal MTJ element as a memory cell; instead, this device may use a two-terminal MTJ element (see FIG. 2B) as a memory cell. In this case, for example, the memory circuit device has a configuration as illustrated in FIG. 10 (the second embodiment of the present invention). Since memory cells 18(0) to 18(n-1) are each constituted of a two-terminal MTJ element in this memory circuit device, the write transistors 13(0) to 13(n-1) used in the case of the three-terminal MTJ element (see FIG. 1) can be eliminated. Note, however, that the n access transistors 12(0) to 12(n-1) constituting the access transistor array 12 are used not only for the read operation in the read circuit unit 30 but also for the write operation in the write circuit unit 20, and therefore transistors used as the access transistor array 12 need to have a performance high enough to guarantee the write operation.

Figure 10:
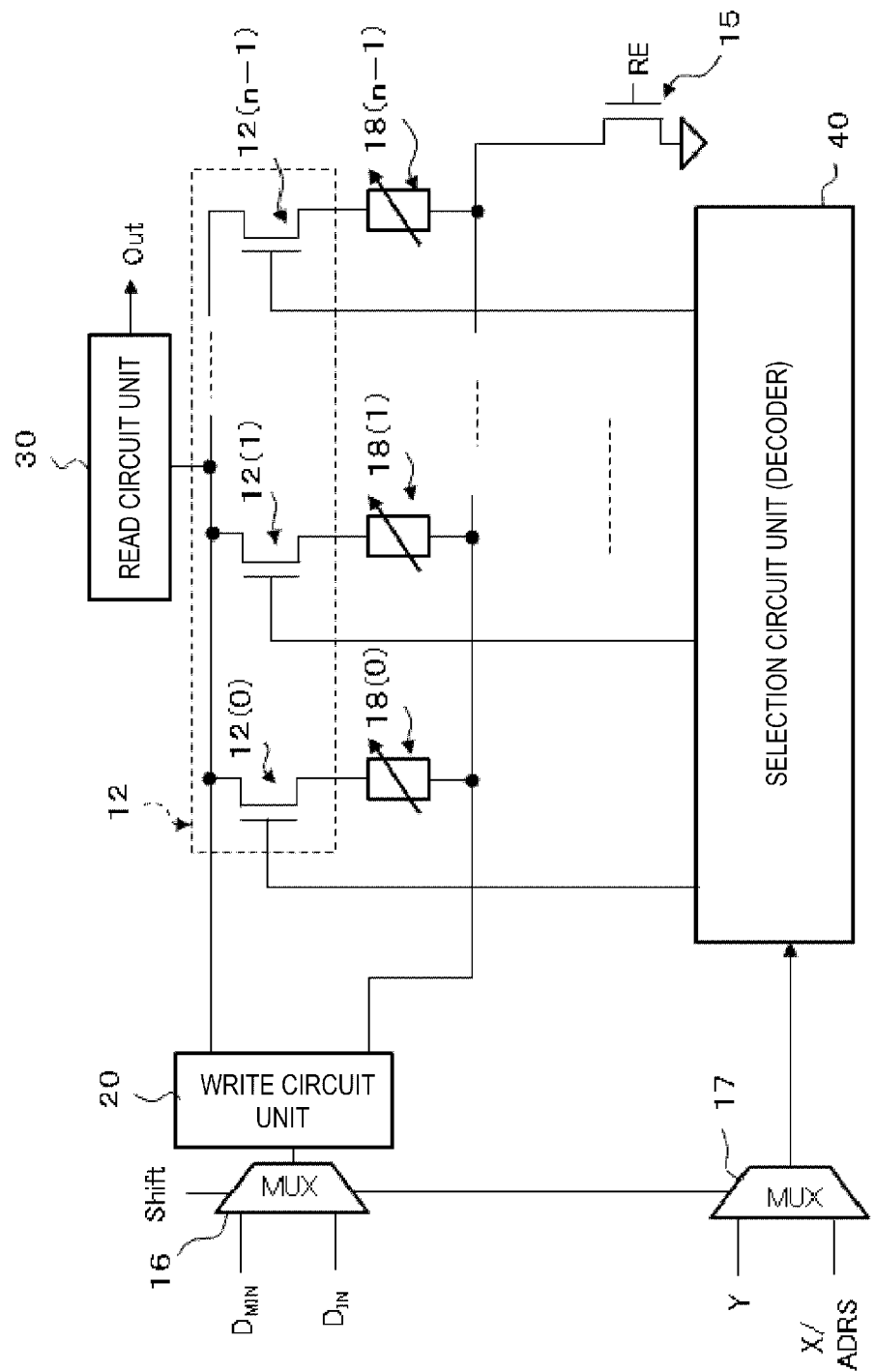
FIG. 10 is a circuit diagram illustrating a memory circuit device according to another embodiment of the present invention.

In the memory circuit device illustrated in FIG. 10 which uses the two-terminal MTJ element as the memory cell, the configuration of each of the write circuit unit 20, the read circuit unit 30, and the selection circuit unit 40 is the same as that of the memory circuit device described above (see FIGS. 3 to 5). Note, however, that the write circuit unit 20 illustrated in FIG. 10 includes the two write control transistors 14a and 14b illustrated in FIG. 1 (see FIG. 3).

In addition, the memory cells are not limited to MTJ elements, and may be memory elements of another type as long as they are resistive memory elements.

Figure 11:
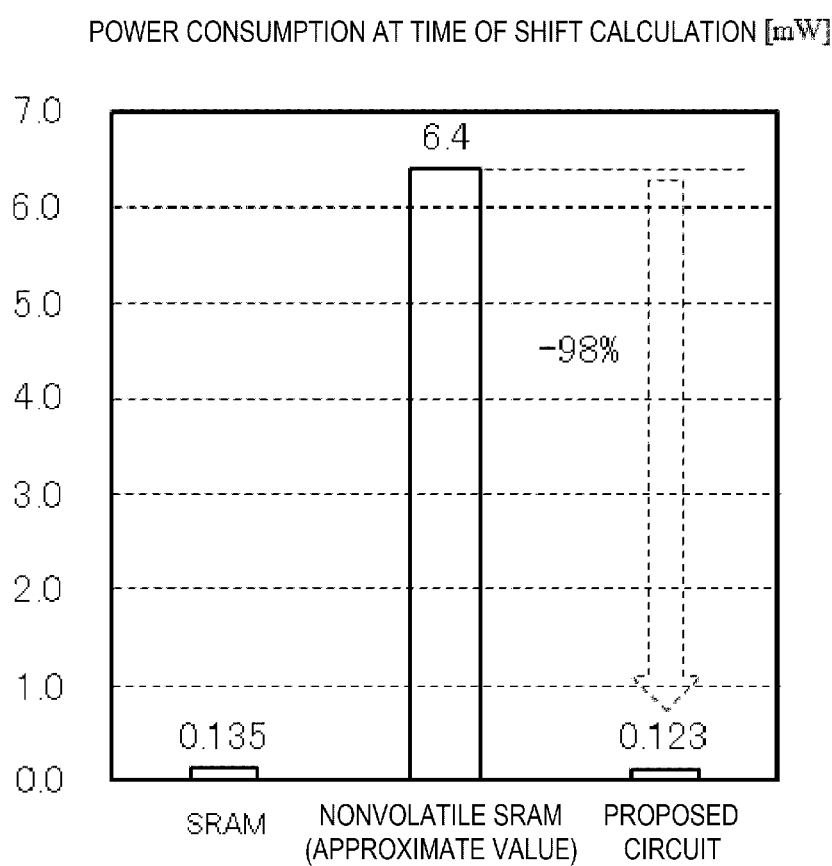
FIG. 11 is a diagram illustrating a comparison between a product mounting thereon the memory circuit device according to the present invention and that mounting thereon an existing device with respect to power consumption at the time of shift calculation.
Figure 12:
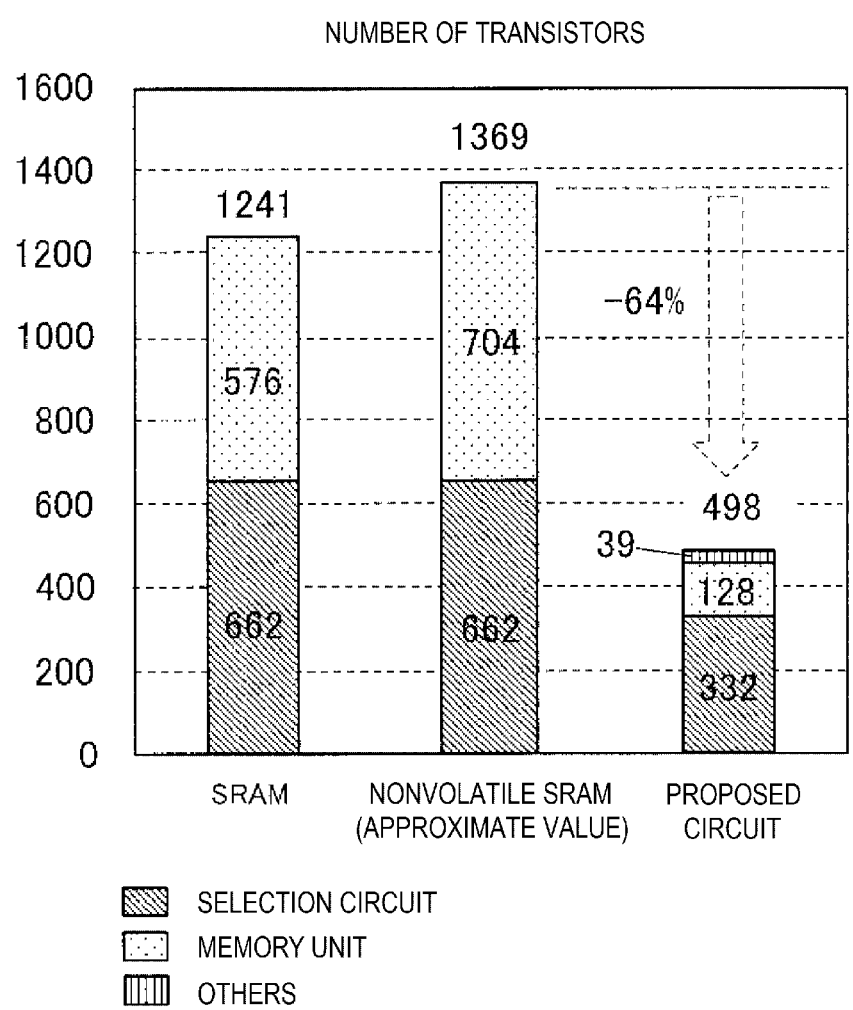
FIG. 12 is a diagram illustrating a comparison between the product mounting thereon the memory circuit device according to the present invention and that mounting thereon the existing device with respect to the number of transistors constituting the product.
Figure 13:
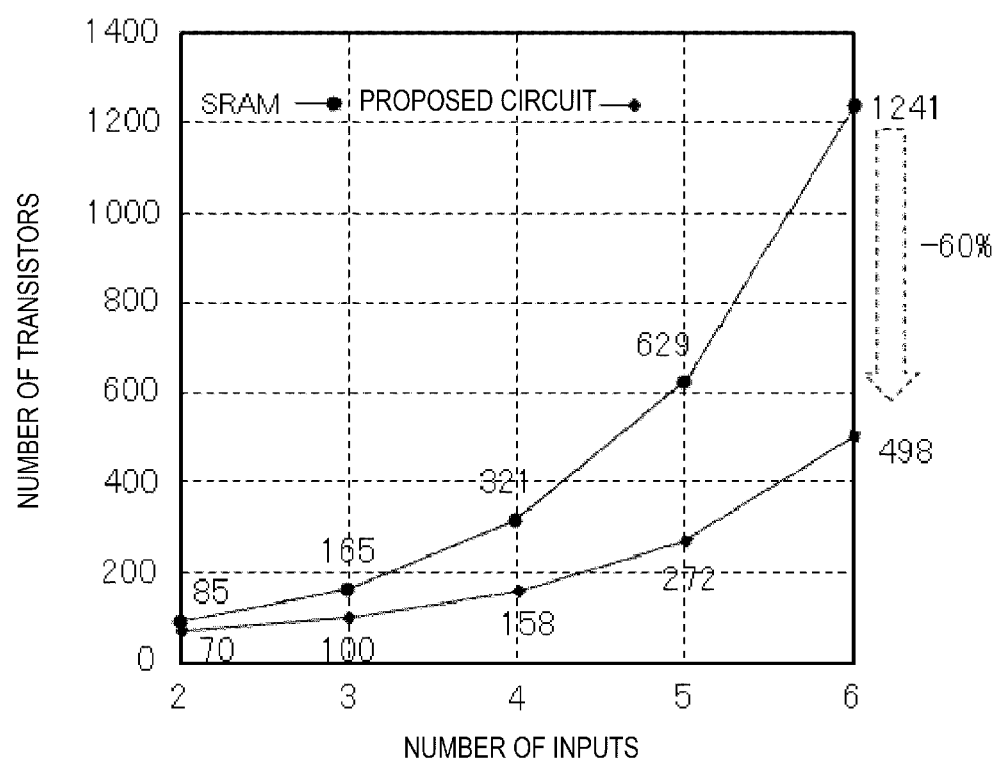
FIG. 13 is a diagram illustrating a comparison between the product mounting thereon the memory circuit device according to the present invention and that mounting thereon the existing device with respect to the number of transistors, constituting the product, for the number of inputs.

As illustrated in FIG. 11, the power consumption of one example of the memory circuit device according to the present invention (proposed circuit) at the time of shift calculation is at the same level as the power consumption of a device using an SRAM, and can be reduced significantly as compared with the power consumption of a device using a nonvolatile SRAM. In addition, as illustrated in FIG. 12, the number of transistors, constituting the memory circuit device, of one example of the memory circuit device according to the present invention (proposed circuit) can be reduced largely as compared with that of the device using the SRAM and the device using the nonvolatile SRAM. Besides, as illustrated in FIG. 13, one example of the memory circuit device according to the present invention (proposed circuit) exhibits more remarkable reduction effect in terms of the circuit size as the number of inputs becomes larger.

The memory device described above is not limited to that formed by the logic-in-memory (LIM) circuit technology. For example, it is also possible to use a memory circuit device constituted basically of a Static Random Access Memory (SRAM). In this case, the selection circuit unit may also be shared by both of the write circuit unit and the read circuit unit. This device can also implement the function of the shift register as described above by setting a read address (a cell to be designated by cell designating information) and a write address (a memory cell to be designated by the cell designating information) at the same value, reading data of the address thus set (the memory cell to be designated by the cell designating information), writing a new value to this address (the memory cell to be designated by the cell designating information), and then incrementing the address.

In addition, another similar memory circuit device may be configured using a nonvolatile SRAM and other memory elements.

Note that the present invention is not limited to the above embodiments and their modification examples. Various modifications to them are possible based on the gist of the present invention, and these modifications are not excluded from the scope of the present invention.

INDUSTRIAL APPLICABILITY

The memory circuit device according to the present invention has an effect of further downsizing a circuit, and is useful as a memory circuit device equipped with multiple memory cells, a write circuit unit that writes data to each of the memory cells, and a read circuit unit that reads, from each of the memory cells, data written in this memory cell.

REFERENCE SIGNS LIST

11(0) to 11(n-1): memory cell
12: access transistor array
12(0) to 12(n-1): access transistor
13(0) to 13(n-1): transistor
14a and 14b: write control transistor
15: read control transistor
20: write circuit unit
30: read circuit unit
31: resistance division unit
32: inversion unit
33: latch unit
40: selection circuit unit (decoder circuit unit)

The invention claimed is:

1. A memory circuit device comprising:
a plurality of memory cells, each of which is a resistive memory element having one read terminal and two write terminals;
a write circuit unit that is configured to write data to a memory cell of the plurality of memory cells which is designated by cell designating information; and
a read circuit unit that is configured to read out, from the memory cell designated by the cell designating information, data written in the memory cell;
wherein the memory circuit device is configured to output the data that was read out from the memory cell by the read circuit unit, the data representing a result of a calculation defined by a predetermined calculation algorithm corresponding to the cell designating information as input information
wherein the memory circuit device comprises:
a selection circuit unit that is shared by both of the write circuit unit and the read circuit unit and configured to select a memory cell to be activated from the plurality of memory cells based on the cell designating information; and
a control circuit unit that is configured to selectively enable any one of writing of data by the write circuit unit and reading of data by the read circuit unit to the memory cell selected by the selection circuit unit;
wherein the control circuit unit includes a cell-associated write control circuit unit that is configured to selectively enable any one of writing of data by the write circuit unit and a cell-associated access control circuit unit that is configured to selectively enable any one of reading of data by the read circuit unit, the cell-associated access control circuit unit is connected to the one read terminal and the read circuit unit, and the cell-associated write control circuit unit is connected to one of the two write terminals and a write line extending from the write circuit unit; and
wherein selection signal lines corresponding respectively with the plurality of memory cells extend from the selection circuit unit, and one selection signal line of the selection signal lines is connected to both of the cell-associated access control circuit unit and the cell-associated write control circuit unit connected with the corresponding memory cell.

2. The memory circuit device according to claim 1, wherein the control circuit unit includes:

a write control circuit unit that is configured to enable, based on a write enable signal, the write circuit unit to write data to the memory cell selected by the selection circuit unit; and a read control circuit unit that is configured to enable, based on a read enable signal, the read circuit unit to read data from the memory cell selected by the selection circuit unit.

3. The memory circuit device according to claim 2, wherein the selection circuit unit includes a decoder circuit unit that is configured to convert the cell designating information into a cell selection signal which corresponds to the memory cell designated by the cell designating information, and output the cell selection signal, and the cell-associated write control circuit unit that is configured to allows, in response to the cell selection signal output from the decoder circuit unit, the write circuit unit to write data to the memory cell which corresponds to the cell selection signal; and the cell-associated access control circuit unit allows, in response to the cell selection signal output from the decoder circuit unit, the read circuit unit to access the memory which corresponds to the cell selection signal.

4. A method for using the memory circuit device according to claim the plurality of memory cells including n (n is an integer of 2 or larger) memory cells from first to n-th memory cells arranged in an array, the method comprising:

a cell designation step of supplying, in a state where data is written in the n memory cells, the selection circuit unit with cell designating information in which a memory cell designated by the cell designating information changes sequentially so as to iterate over the first memory cell to the n-th memory cell;

a data readout step of supplying the read enable signal to the read control circuit unit and, while a memory cell designated by the cell designating information changes so as to iterate over the first memory cell to the n-th memory cell, thereby causing the read circuit unit to read data from a memory cell selected by the selection circuit unit based on the cell designating information; and a data write step of supplying the write enable signal to the write control circuit unit instead of the read enable signal every time the readout of data by the read circuit unit is over, and thereby causing the write circuit unit to write data to the memory cell selected by the selection circuit unit based on the cell designating information at the time of the readout of data.

5. The memory circuit device according to claim 1, further comprising:

a data switching circuit unit that is configured to switch a data string to be supplied to the write circuit unit between a first data string and a second data string according to a shift control signal; and a cell designating information switching circuit unit that is configured to switch the cell designating information to be supplied to the selection circuit unit between first cell designating information and second cell designating information according to the shift control signal.

6. The memory circuit device according to claim 1, wherein each of the plurality of memory cells is a magnetoresistive memory cell.

7. A method for using the memory circuit device according to claim the plurality of memory cells including n (n is an integer of 2 or larger) memory cells from first to n-th memory cells arranged in an array, the method comprising:

a cell designation step of supplying, in a state where data is written in each of the n memory cells, the selection circuit unit with cell designating information in which a memory cell designated by the cell designating information changes sequentially among the first memory cell to the n-th memory cell; and a data readout step of causing the control circuit unit to enable the read circuit unit to read data and, while a memory cell designated by the cell designating information changes sequentially among the first memory cell to the n-th memory cell, thereby causing the read circuit unit to read data from a memory cell selected by the selection circuit unit based on the cell designating information.

8. A method for using the memory circuit device according to claim the plurality of memory cells including n (n is an integer of 2 or larger) memory cells from first to n-th memory cells arranged in an array, the method comprising:

a cell designation step of supplying, in a state where data is written in the n memory cells, the selection circuit unit with cell designating information in which a memory cell designated by the cell designating information changes sequentially so as to iterate over the first memory cell to the n-th memory cell;

a data readout step of causing the control circuit unit to enable the read circuit unit to read data and, while a memory cell designated by the cell designating information changes so as to iterate over the first memory cell to the n-th memory cell, thereby causing the read circuit unit to read data from a memory cell selected by the selection circuit unit based on the cell designating information; and a data write step of causing the control circuit unit to enable the write circuit unit to write data instead of enabling the read circuit unit to read data every time the readout of data by the read circuit unit is over, and thereby causing the write circuit unit to write data to the memory cell selected by the selection circuit unit based on the cell designating information at the time of the readout of data.

9. The memory circuit device according to claim 1, wherein the selection circuit unit is configured to output cell selection signals, each of the selection signals corresponds to each of the plurality of memory cells, to select a memory cell to be activated from the plurality of memory cells based on the cell designating information.

10. The memory circuit device according to claim 1, wherein the plurality of memory cells are arranged in one dimension.

11. The memory circuit device according to claim 1, wherein the selection circuit unit has transistors connected in a tree shape.

* * * * *